United States Patent
Schulze et al.

(10) Patent No.: US 10,325,996 B2
(45) Date of Patent: Jun. 18, 2019

(54) METHOD FOR PRODUCING A DOPED SEMICONDUCTOR LAYER

(71) Applicant: Infineon Technologies AG, Neubiberg (DE)

(72) Inventors: Hans-Joachim Schulze, Taufkirchen (DE); Franz Hirler, Isen (DE); Anton Mauder, Kolbermoor (DE); Helmut Strack, Munich (DE); Frank Kahlmann, Neubiberg (DE); Gerhard Miller, Penzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/724,604

(22) Filed: Oct. 4, 2017

(65) Prior Publication Data

US 2018/0061962 A1 Mar. 1, 2018

Related U.S. Application Data

(62) Division of application No. 13/539,944, filed on Jul. 2, 2012, now abandoned.

(51) Int. Cl.

| | |
|---|---|
| *H01L 21/22* | (2006.01) |
| *H01L 29/66* | (2006.01) |
| *H01L 29/36* | (2006.01) |
| *H01L 29/739* | (2006.01) |
| *H01L 29/74* | (2006.01) |
| *H01L 21/265* | (2006.01) |

(Continued)

(52) U.S. Cl.

CPC .... *H01L 29/66348* (2013.01); *H01L 21/2658* (2013.01); *H01L 29/0878* (2013.01); *H01L 29/102* (2013.01); *H01L 29/1095* (2013.01); *H01L 29/167* (2013.01); *H01L 29/36* (2013.01); *H01L 29/7397* (2013.01); *H01L 29/7428* (2013.01); *H01L 29/7802* (2013.01); *H01L 29/7811* (2013.01); *H01L 29/7813* (2013.01); *H01L 29/7816* (2013.01); *H01L 29/861* (2013.01); *H01L 29/872* (2013.01); *H01L 21/2205* (2013.01); *H01L 29/0619* (2013.01); *H01L 29/0634* (2013.01); *H01L 29/0638* (2013.01); *H01L 29/165* (2013.01); *H01L 29/402* (2013.01); *H01L 29/404* (2013.01); *H01L 29/407* (2013.01)

(58) Field of Classification Search

CPC ..... H01L 21/22; H01L 21/2225; H01L 21/24; H01L 21/242; H01L 21/40
See application file for complete search history.

(56) References Cited

U.S. PATENT DOCUMENTS

| | | |
|---|---|---|
| 8,133,789 B1 | 3/2012 | Cooper et al. |
| 8,159,024 B2 | 4/2012 | Chow et al. |

(Continued)

FOREIGN PATENT DOCUMENTS

| | | |
|---|---|---|
| CN | 102214692 A | 10/2011 |
| WO | 2007025392 A1 | 3/2007 |

*Primary Examiner* — Jae Lee
(74) *Attorney, Agent, or Firm* — Murphy, Bilak & Homiller, PLLC

(57) ABSTRACT

A semiconductor device is produced by providing a semiconductor substrate, forming an epitaxial layer on the semiconductor substrate, and introducing dopant atoms of a first doping type and dopant atoms of a second doping type into the epitaxial layer.

17 Claims, 10 Drawing Sheets

(51) Int. Cl.
*H01L 29/78* (2006.01)
*H01L 29/861* (2006.01)
*H01L 29/872* (2006.01)
*H01L 29/08* (2006.01)
*H01L 29/10* (2006.01)
*H01L 29/167* (2006.01)
H01L 29/40 (2006.01)
H01L 29/06 (2006.01)
H01L 29/165 (2006.01)

(56) References Cited

U.S. PATENT DOCUMENTS

| | | |
|---|---|---|
| 8,633,095 B2 | 1/2014 | Schulze et al. |
| 2008/0001158 A1 | 1/2008 | Das et al. |
| 2009/0078962 A1 | 3/2009 | Ankoudirtov et al. |
| 2009/0134388 A1 | 5/2009 | Yamauchi et al. |
| 2010/0032685 A1 | 2/2010 | Zhang et al. |
| 2010/0078708 A1 | 4/2010 | Willmeroth et al. |
| 2010/0133550 A1 | 6/2010 | Zhang et al. |
| 2010/0144105 A1 | 6/2010 | Waite et al. |
| 2010/0313161 A1 | 12/2010 | Le Chevalier et al. |
| 2011/0042641 A1* | 2/2011 | Lieber .............. B82Y 30/00 257/9 |
| 2011/0241114 A1 | 10/2011 | Su et al. |
| 2012/0112275 A1 | 5/2012 | Steinmann et al. |
| 2013/0075855 A1* | 3/2013 | Guan .............. H01L 29/0634 257/487 |
| 2013/0134511 A1 | 5/2013 | Yang et al. |

* cited by examiner

METHOD FOR PRODUCING A DOPED SEMICONDUCTOR LAYER

TECHNICAL FIELD

Embodiments of the present invention relate to a semiconductor device, and to a method for producing a doped semiconductor layer.

BACKGROUND

One important aim in the development of power semiconductor devices, such as power transistors or power diodes, is to produce devices with a high voltage blocking capability but, nevertheless, a low on-resistance ($R_{ON}$).

Power semiconductor devices, such as power transistors or power diodes, usually include a drift region that mainly defines the voltage blocking capability and the on-resistance of the semiconductor device. In a power transistor, such as a power MOSFET or a power IGBT, the drift region is arranged between a body region and a drain region and is doped lower than the drain region. In a power diode (where the drift region is also referred to as base region) the drift region is arranged between a p-emitter and an n-emitter and has a lower effective doping concentration than each of the two emitter regions.

The on-resistance of a conventional power transistor is dependent on the length of the drift region in a current flow direction and on the effective doping concentration of the drift region, wherein the on-resistance decreases when the length of the drift region is reduced or when the effective doping concentration in the drift region is increased. In a diode or an IGBT, the voltage drop across the drift region when the diode or the IGBT is forward biased is dependent on the length of the drift region in a current flow direction and on the effective carrier concentration of the drift region, wherein the voltage decreases and, therefore, losses are reduced, when the length of the drift region is reduced or when the effective carrier concentration is increased. When a bipolar device like the diode or the IGBT is forward biased injection of electrons and holes increases the effective carrier concentration of the drift region to above the doping concentration of the drift region. However, in a transistor as well as in a diode, reducing the length of the region or increasing the doping concentration reduces the voltage blocking capability.

SUMMARY

A first embodiment relates to a semiconductor device with a drift region. The drift region includes at least one drift region section including dopant atoms of a first doping type and with a first doping concentration of at least 1E16 $cm^{-3}$ and dopant atoms of a second doping type and with a second doping concentration of at least 1E16 $cm^{-3}$.

A second embodiment relates to a method of producing a semiconductor device. The method includes providing a semiconductor substrate, forming an epitaxial layer on the semiconductor substrate, and introducing dopant atoms of a first doping type and dopant atoms of a second doping type into the epitaxial layer.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGS. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
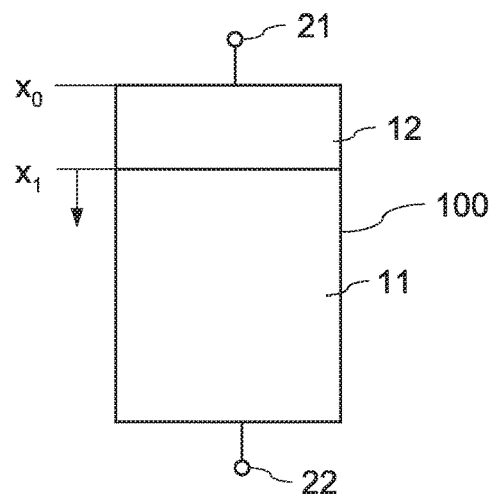
FIG. 1 illustrates a vertical cross sectional view of a semiconductor device including a drift region.

FIG. 1 illustrates a cross sectional view of a semiconductor device according to a first embodiment. The semiconductor device includes a semiconductor body 100, a drift region 11 in the semiconductor body 100 and a device junction between the drift region 11 and a first device region 12. The device junction is either a pn junction when the first device region is a doped semiconductor region, or a Schottky junction when the first device region 12 is a Schottky region or a Schottky metal. A Schottky metal is, e.g., aluminum (Al), tungsten silicide (WSi), tantalum silicide (TaSi), titanium silicide (TiSi), platinum silicide (PtSi), or cobalt silicide (CoSi).

The semiconductor material of the semiconductor body may be a conventional semiconductor material such as, e.g., silicon (Si), silicon germanium (SiGe), silicon carbide (SiC), gallium nitride (GaN), gallium aluminium nitride (GaAlN) or the like.

The first device region 12 is electrically coupled to a first electrode or terminal 21, and the drift region 11 is electrically coupled or connected to a second electrode or terminal 22. These first and second electrodes 21, 22 are only schematically illustrated in FIG. 1.

The drift region 11 is a doped (monocrystalline) semiconductor region that includes dopant atoms of a first doping type (n or p) and dopant atoms of a second doping type (p or n) complementary to the first doping type. These dopant atoms are homogenously or at least almost homogenously distributed in the drift region 11. "At least almost homogenously distributed" means, that the doping concentration of the first dopant atoms and the doping concentration of the second dopant atoms in the drift region 11 differs less than a factor 5, or even less than a factor 2 in vertical direction.

A first doping concentration of the first dopant atoms is at least 1E16 cm$^{-3}$ or at least 1E17 cm$^{-3}$, and a second doping concentration of the second dopant atoms is at least 1E16 cm$^{-3}$, at least 1E17 cm$^{-3}$, or at least 5E17 cm$^{-3}$. The drift region 11 may have a net doping or effective doping of one of the first and second doping types. The net doping $N_{NET}$ of the drift region 11 is given by the absolute value of the difference between the first and second doping concentrations, i.e.

$$N_{NET} = |N_1 - N_2| \qquad (1)$$

where $N_1$ is the first doping concentration, and $N_2$ is the second doping concentration. The net doping of the drift region 11 is a doping of the first doping type when the first doping concentration $N_1$ is higher than the second doping concentration $N_2$, and the net doping of the drift region 11 is a doping of the second doping type when the second doping concentration $N_2$ is higher than the first doping concentration $N_1$. According to one embodiment, the net doping $N_{NET}$ is between 1E12 cm$^{-3}$ and 1E16 cm$^{-3}$ or between 1E12 cm$^{-3}$ and 1E14 cm$^{-3}$. According to one embodiment, the net doping is at least 100 (1E2) times smaller than each of the first and second doping concentrations.

According to one embodiment, the dopant atoms of the first doping type are dopant atoms of the same type, such as phosphorous atoms, arsenic atoms, nitrogen atoms, silicon atoms or antimony atoms, and the dopant atoms of the second doping type are dopant atoms of the same type, such as boron atoms, indium atoms, gallium atoms, calcium atoms, zinc atoms, beryllium atoms, magnesium atoms or aluminum atoms. Boron (B) atoms, gallium (Ga) atoms, aluminum (Al) atoms and indium (In) atoms are p-type doping atoms in silicon (Si) and in silicon carbide (SiC), and phosphorous (P) atoms, arsenic (As) atoms and antimony (Sb) atoms are p-type doping atoms in silicon (Si) and in silicon carbide (SiC). In silicon carbide (SiC), also nitrogen (N) could be used as a donator (n-type doping atom). In gallium nitride (GaN), silicon (Si) atoms are dopant atoms of the first type, while calcium (Ca) atoms, (Zn) zinc atoms, beryllium (Be) atoms, and magnesium (Mn) atoms are dopant atoms of the second type. According to a further embodiment, different types of dopant atoms are used to effect the doping of one doping type.

The net doping of the drift region 11 defines the ohmic resistance of the drift region 11, where the ohmic resistance decreases when the net doping $N_{NET}$ increases. The net doping $N_{NET}$ is zero or close to zero when the first and second doping concentrations $N_1$, $N_2$ are equal. In this case, the ohmic resistance of the drift region 11 corresponds to the ohmic resistance of an intrinsic semiconductor material. For technological reasons, the doping concentrations of the first and second dopant atoms cannot be exactly equal, so that the net doping concentration $N_{NET}$ cannot be exactly zero. In the following, the first doping concentration and the second doping concentration are considered to be equal when the difference between these doping concentrations is less than 5E12 cm$^{-3}$, so that the net doping is less than 5E12 cm$^{-3}$, or if the net doping is at least 300 or at least 1000 times smaller than each of the first and second doping concentrations.

When the first and second doping concentrations $N_1$, $N_2$ are equal, each dopant atom of the first doping type has a corresponding dopant atom of the second doping type, so that each dopant atom of one doping type is compensated by a corresponding dopant atom of the complementary doping type. Dopant atoms that are compensated by a complementary dopant atom do not contribute to the electrical conduction of the drift region 11 and, therefore, do not reduce the ohmic resistance of the drift region 11. However, doping the drift region 11 with dopant atoms of two different doping types may help to reduce the charge carrier mobility in the drift region 11 and may therefore help to increase the voltage blocking capability of the semiconductor device. This is explained in greater detail herein below.

Figure 2:
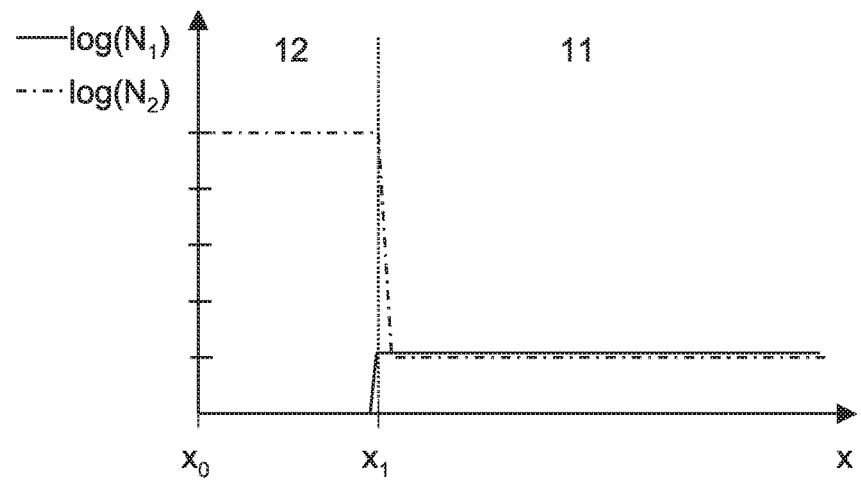
FIG. 2 illustrates an embodiment of a doping profile of the drift region of FIG. 1.

FIG. 2 schematically illustrates a doping profile of the semiconductor device of FIG. 1 along a current flow direction x of the semiconductor device. The current flow direction x is a direction in which a current flows through the semiconductor device when a voltage is applied between the first and second load terminals 21, 22 that biases the device junction between the drift region 11 and the first device region 12 in a forward direction. Referring to FIG. 1, the current flow direction x is a direction perpendicular to the device junction.

In FIG. 2, the first doping concentration is illustrated as a solid line, while the second doping concentration is illustrated as a dashed and dotted line. Referring to FIG. 2, the drift region 11 includes dopant atoms of the first doping type and dopant atoms of the second doping type, where these dopant atoms are homogenously or at least almost homogenously distributed in the drift region 11. The doping concentration $N_1$ of the first dopant atoms and $N_2$ of the second dopant atoms is at least $1E16$ cm$^{-3}$ or at least $1E17$ cm$^{-3}$. Referring to the explanation before, the first and second doping concentrations $N_1$, $N_2$ can be slightly different, so that a drift region 11 has a net doping or an effective doping of one of the first and second doping types. In the embodiment illustrated in FIG. 2, the first doping concentration $N_1$ is slightly higher than the second doping concentration $N_2$, so that the drift region 11 has an effective doping concentration of the first doping type. In the embodiment illustrated in FIG. 2, the further device region 12 is a doped semiconductor region of the second doping type complementary to the first doping type. The further device region 12 may have the same or even a higher doping concentration of dopant atoms of the first doping type as the drift region 11. However, the doping concentration of dopant atoms of the second doping type in the first device region 12 is higher than the doping concentration of dopant atoms of the first doping type, so that the first device region 12 has an effective doping or net doping of the second doping type.

The effect of having dopant atoms of both doping types in the drift region 11 is explained in the following. When the semiconductor device is in an on-state in which a current flows through the drift region 11, an ohmic resistance of the drift region 11 is dependent on the effective doping concentration and—in the case of bipolar devices—on the effective carrier concentration in the drift region 11 and of the length of the drift region 11, where the ohmic resistance decreases when the effective doping concentration increases, and where the ohmic resistance increases when the length of the drift region 11 increases. In the following, the wording "effective doping concentration" in the on-state is used for both, the effective doping concentration in unipolar devices, and the effective carrier concentration in bipolar devices, although in bipolar devices the effective carrier concentration may exceed the background net doping concentration by some orders of magnitude. In the off-state of bipolar device, the mobile charges forming the effective carrier concentration during the on-state are removed from the drift region by an electric field expanding in the drift region 11 leaving only the fixed charges of the first and second doping type. The length of the drift region 11 is the dimension of the drift region 11 in the current flow direction x. The semiconductor device is in an off-state when the device junction between the drift region 11 and the first device region 12 is reverse biased so that a depletion region or space charge region expands in the drift region 11 beginning at the device junction. When, for example, the first doping type is an n-type doping and the second doping type is a p-type doping, so that the drift region 11 has an n-type effective doping and the first device region 12 has a p-type effective doping, the device junction can be reverse biased by applying a positive voltage between the second load terminals 22 and the first load terminal 21.

The width of the depletion region that expands in the drift region 11 when the device junction is reverse biased, is dependent on the voltage that reverse biases the junction. The width of the depletion region is a dimension of the depletion region in the current flow direction and increases when the voltage reverse biasing the junction increases. Within the depletion region there are ionized dopant atoms of the first doping type in the drift region 11 and corresponding ionized dopant atoms in the first device region 12. The ionization of the dopant atoms on both sides of the junction causes an electric field. The voltage blocking capability of the semiconductor device is reached when the electrical field generated by these ionized dopant atoms in the drift region 11 and by corresponding ionized dopant atoms in the first device region 12 reaches the critical electrical field. The critical electrical field is a material constant of the semiconductor material of the semiconductor body 100.

By increasing the density of ionized dopant atoms free carriers are scattered more frequently. Thus the mean free path length of these carriers is reduced. For gaining enough energy to generate another electron-hole pair the carriers must be accelerated on a shorter way which means by a higher electric field as compared to a device with a lower density of ionized dopant atoms. Thus, by reducing the mean free path of carriers the critical electrical field strength of the semiconductor material may be enhanced. In other words, by decreasing the mobility of the free charge carriers the scattering processes result in a reduced velocity of the free charge carriers for a certain electrical field strength preventing avalanche phenomena. Therefore, the critical electrical field is enhanced.

The basic device structure with a drift region 11 including dopant atoms of the first doping type and dopant atoms of the second doping type, a first device region 12 and a junction between the drift region 11 and the first device region 12 as illustrated in FIG. 1, and as explained with reference to FIGS. 1 and 2 can be used in a plurality of different semiconductor devices, specifically in power semiconductor devices. Some embodiments of those power semiconductor devices including a basic device structure as illustrated in FIG. 1 are explained with reference to further figures below.

Figure 3:
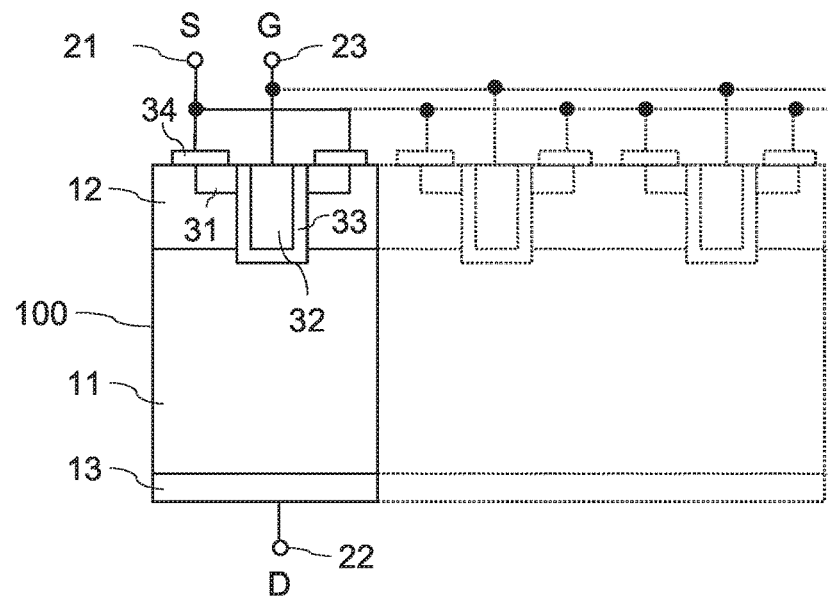
FIG. 3 illustrates a first embodiment of a semiconductor device implemented as a vertical MOS transistor.

FIG. 3 illustrates a vertical cross sectional view of a power transistor, specifically of an MOS power transistor including a basic device structure with a drift region 11 and a first device region 12 as explained with reference to FIGS. 1 and 2. In the MOS transistor of FIG. 3, the drift region 11 has an effective doping of the first doping type. The first device region 12 is a body region of the MOS transistor and has an effective doping of the second doping type. The MOS transistor further includes a source region 31 with an effective doping complementary to the effective doping of the body region 12 and separated from the drift region 11 by the body region 12. The first load terminal 21 is a source terminal S of the MOS transistor and is electrically connected to the body region 12 and the source region 31 through a source electrode 34. A gate electrode 32 is adjacent the body region 12 and extends from the source region 31 to or into the drift region 11 along the body region 12 and is dielectrically insulated from the body region 12 and the other semiconductor regions by a gate dielectric 33. The gate electrode 32 is electrically connected to a gate terminal G of the MOS transistor.

Referring to FIG. 3, the MOS transistor further includes a drain region 13 separated from the body region 12 by the drift region 11. The second load terminal 22 forms a drain terminal of the MOS transistor and is coupled to the drift region 11 through the drain region 13. The drain region 13 may be heavily doped with dopant atoms having a doping type corresponding to the doping type of the dopant atoms in the source region 31. The drain region 13 may include further semiconductor regions (not illustrated) such as a field stop or contact regions.

The MOS transistor can be implemented as an n-type transistor or as a p-type transistor, where the conduction type is defined by the doping type of the source region 31. The doping type of the source region 31 is defined by the doping type of the effective doping concentration of the source region. Equivalently, the doping type of any other device region is defined by the doping type of the effective doping concentration of that device region.

In an n-type transistor the source region 31 and the drift region 11 have an effective n-doping, while the body region 12 has an effective p-doping. In a p-type transistor the source region 31 and the drift region 11 have an effective p-doping, while the body region 12 has an effective n-doping. The MOS transistor can be implemented as an enhancement transistor or as a depletion transistor. Further, the MOS transistor can be implemented as a MOSFET or as an IGBT. In a MOSFET the effective doping of the drain region 13 has the same doping type as the source region 31 and the drift region 11, while in an IGBT the drain region 13 has an effective doping of a doping type complementary to the doping type of the effective doping of the source region 31 and the drift region 11. In an IGBT the source terminal S is also referred to as emitter, while the drain terminal D is also referred to as collector.

The MOS transistor of FIG. 3 can be operated like a conventional MOS transistor by applying suitable drive voltages between the gate and source terminals G, S. When, for example, the MOS transistor is an n-type enhancement transistor, the transistor is switched on when a voltage is applied between the gate and source terminals G, S that is higher than a threshold voltage of the MOS transistor. When the MOS transistor is switched off and when a positive voltage is applied between the drain terminal D and the source terminal S, the pn junction between the drift region 11 and the body region 12 is reverse biased, so that a depletion region expands in the drift region 11. The voltage blocking capability of the MOS transistor of FIG. 3 that has a co-doping of dopant atoms of the first doping type and of dopant atoms of the second doping type in the drift region 11 is higher than the voltage blocking capability of a conventional MOS transistor that has a drift region with the same dimensions and with the same effective doping concentration but that does not have a co-doping of first type and second type dopant atoms in the drift region 11.

Referring to the illustration in dotted lines in FIG. 3, the MOS transistor can be implemented with a plurality of identical transistor cells, with each transistor cell including a source region 31, a body region 12 and a section of the gate electrode 32 and the gate dielectric 33. The drift region 11 and the drain region 13 can be shared by the individual transistor cells (can be common to the individual transistor cells). The individual transistor cells are connected in parallel by having the source regions 31 and the body regions 12 connected to the source terminal S and by having the individual sections of the gate electrode 32 connected to the gate terminal G.

Figure 4:
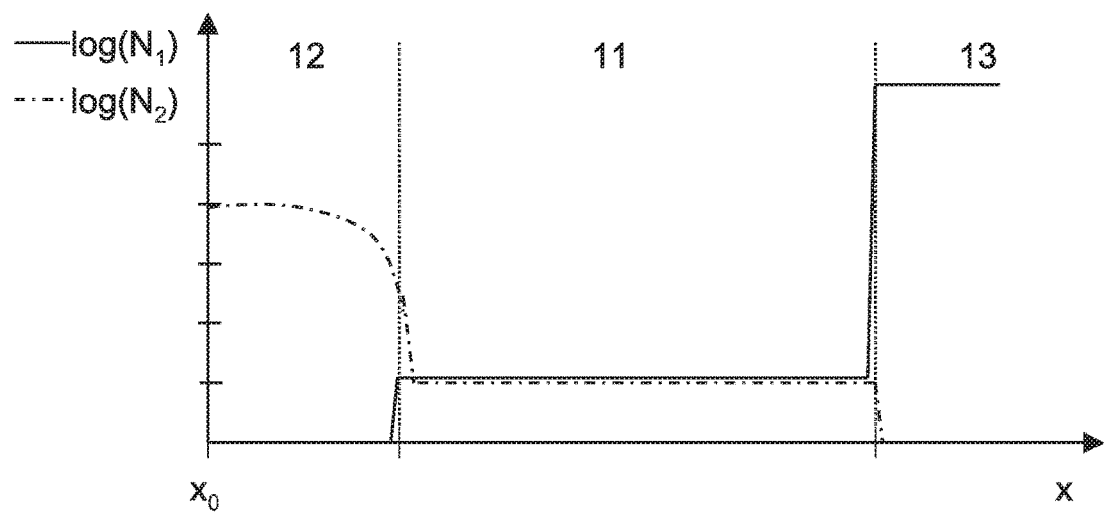
FIG. 4 illustrates the doping profile of a body region, a drift region and a drain region of the MOS transistor of FIG. 3.

FIG. 4 illustrates an embodiment of the doping profile of the body region 12, the drift region 11 and the drain region 13 of the MOS transistor of FIG. 4. In the embodiment illustrated in FIG. 4, the drift region 11 has a net doping of the first doping type, because the doping concentration $N_1$ of the first dopant atoms is higher than the doping concentration $N_2$ of the second dopant atoms. The effective doping concentration is, for example, between 1E13 $cm^{-3}$ and 1E14 $cm^{-3}$, while the doping concentration of the first type and second type dopant atoms is at least 1E16 $cm^{-3}$ or at least 1E17 $cm^{-3}$. Referring to FIG. 4, the body region 12 has an effective doping concentration of the second doping type. The effective doping concentration is, for example, between 1E17 $cm^{-3}$ and 1E19 $cm^{-3}$. In the embodiment illustrated in FIG. 4, the body region 12 also includes dopant atoms of the first doping type, wherein the doping concentration of these dopant atoms may correspond to the doping concentration $N_1$ in the drift region 11. In the embodiment illustrated in FIG. 4, the drain region 13 has an effective doping concentration of the first doping type, wherein the doping concentration is, for example, between 5E19 $cm^{-3}$ and 1E21 $cm^{-3}$. The doping profile illustrated in FIG. 4 is the doping profile of a MOSFET. A doping profile of an IGBT is similar to the doping profile of FIG. 4 with the difference that the doping concentration of the drain region 13 is a doping concentration of the second doping type.

A doping profile as illustrated in FIG. 4 can, for example, be obtained by providing a semiconductor substrate of the first doping type that forms the drain region 13 of the MOS transistor, by forming an epitaxial layer on the semiconductor substrate with a doping corresponding to the doping of the drift region 11, and by implanting and in-diffusing the dopant atoms of the second doping type into the epitaxial layer so as to form the body region 12 resulting e.g. in a Gaussian-like doping profile.

The doping profile as illustrated in FIG. 4 shows an approximately constant doping concentration in the drift region 11 and the drain region 13. However, this is only an example. The doping concentration in the drift region 11 may be varying in a current flow direction. The doping concentration of the first and/or of the second doping type may increase or may decrease towards the drain region 13 or may include homogeneous and inhomogeneous doped regions. The drain region 13 may include an inhomogeneous, e.g., Gaussian-like doping profile.

Figure 5:
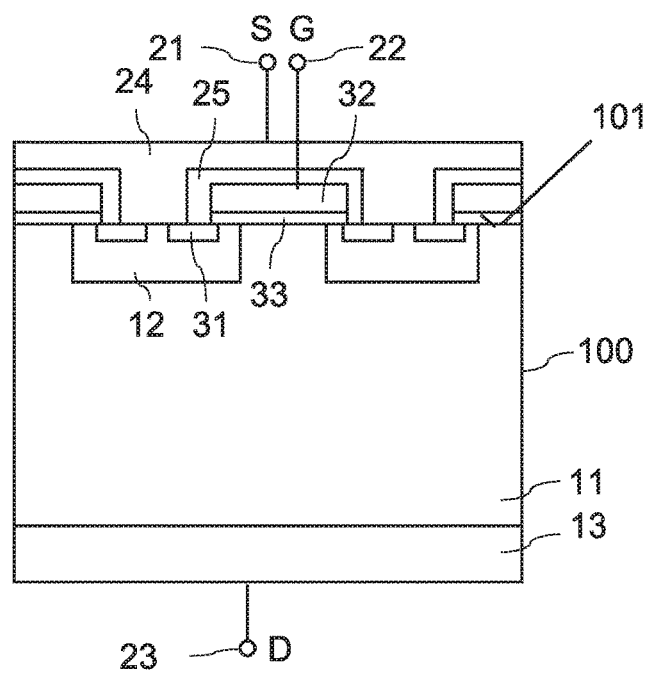
FIG. 5 illustrates a second embodiment of a semiconductor device implemented as a vertical MOS transistor.

The MOS transistor of FIG. 3 has the gate electrode 32 implemented as a trench electrode, which means the gate electrode 32 is located in a trench of the semiconductor body 100. However, this is only an example. Referring to FIG. 5, the MOS transistor could also be implemented with a planar gate electrode 32, which is a gate electrode arranged above a surface 101 of the semiconductor body 100. In this embodiment, sections of the drift region 11 extend to the surface 101 of the semiconductor body 100.

Figure 6:
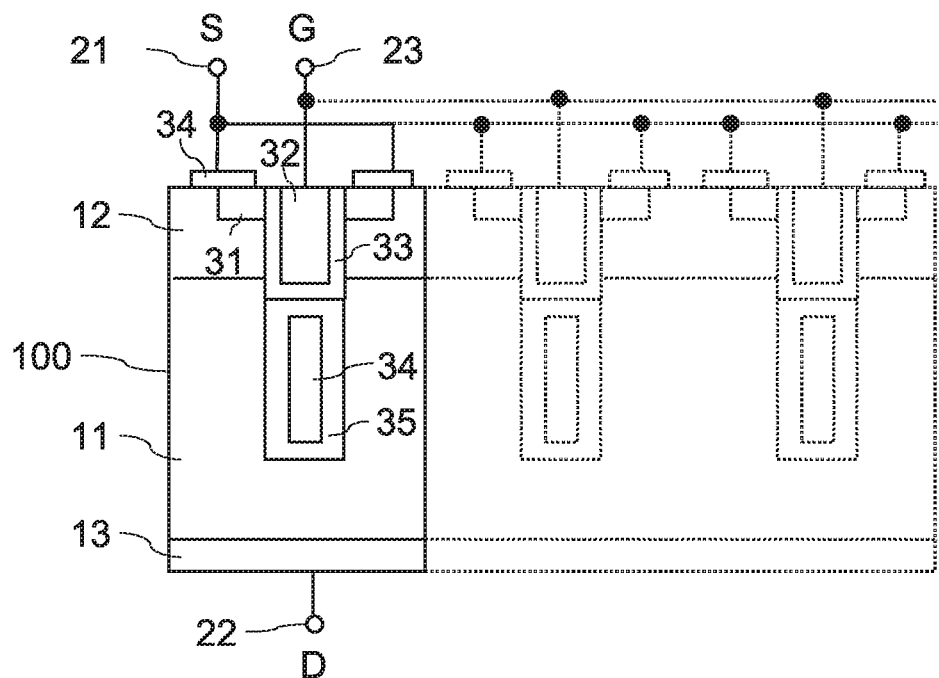
FIG. 6 illustrates an embodiment of a vertical MOS transistor including a field electrode in the drift region.

FIG. 6 illustrates a further embodiment of a semiconductor device implemented as an MOS transistor. The MOS transistor of FIG. 6 is based on the MOS transistor of FIG. 3 and further includes a field electrode 34 arranged in the drift region 11 and dielectrically insulated from the drift region 11 by a field electrode dielectric 35. The field electrode 34 is either electrically connected to the gate terminal G or to the source terminal S. The electrical connection between the field electrode 34 and one of these terminals S, G is not illustrated in detail in FIG. 6. The operating principle of the field electrode 34 in the MOS transistor of FIG. 6 corresponds to the operating principle of a field electrode in a conventional MOS transistor. Such field electrodes are commonly known so that no further explanations are required in this regard.

Figure 7:
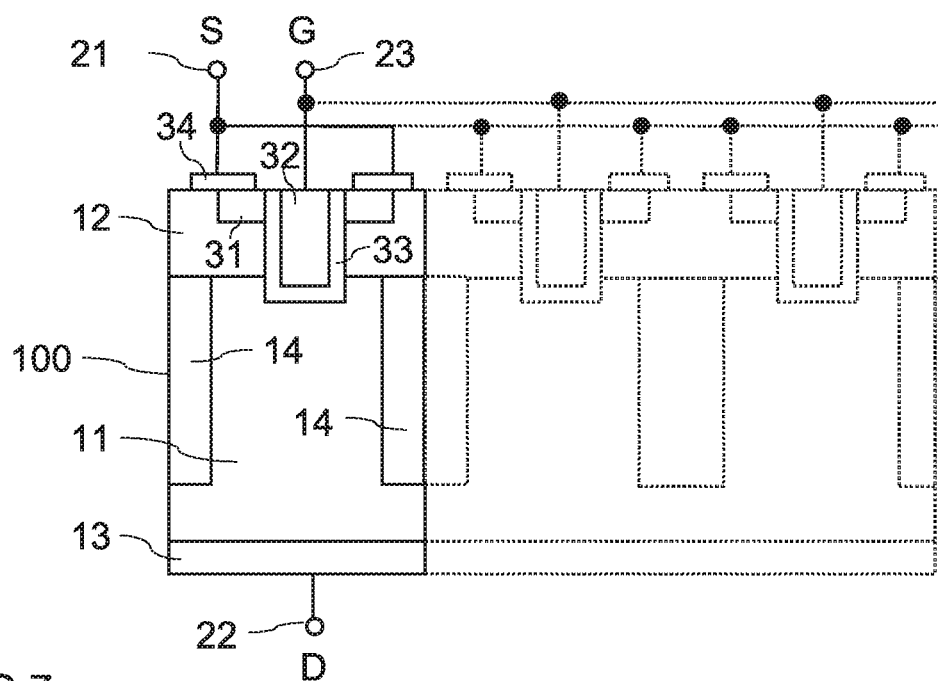
FIG. 7 illustrates an embodiment of a vertical MOS transistor including a compensation region in the drift region.

FIG. 7 illustrates a vertical cross sectional view of an MOS transistor according to a further embodiment. The MOS transistor of FIG. 7 is based on the MOS transistor of FIG. 3 and additionally includes a compensation region 14 in the drift region 11. The compensation region 14 has an effective doping of the second doping type, which is the doping type of the body region 12 and is electrically connected to the source electrode S. In the embodiment of FIG. 7, the compensation region 14 adjoins the body region 12 and is connected to the source terminal S through the body region 12 and the source electrode 34. The MOS transistor of FIG. 7 is a superjunction MOS transistor. When the MOS transistor is in the off-state and the pn junction between the drift region 11 and the body region 12 is reverse biased, a depletion region does not only expand beginning at the pn junction between the drift region 11 and the body region 12, but also expands beginning at the pn junction between the drift region 11 and the compensation region 14. The effective doping concentration of the compensation region 14 may correspond to the effective doping concentration of the drift region 11. The operating principle of the MOS transistor of FIG. 7 corresponds to the operating principle of a conventional superjunction transistor, so that no further explanations are required in this regard.

Figure 8:
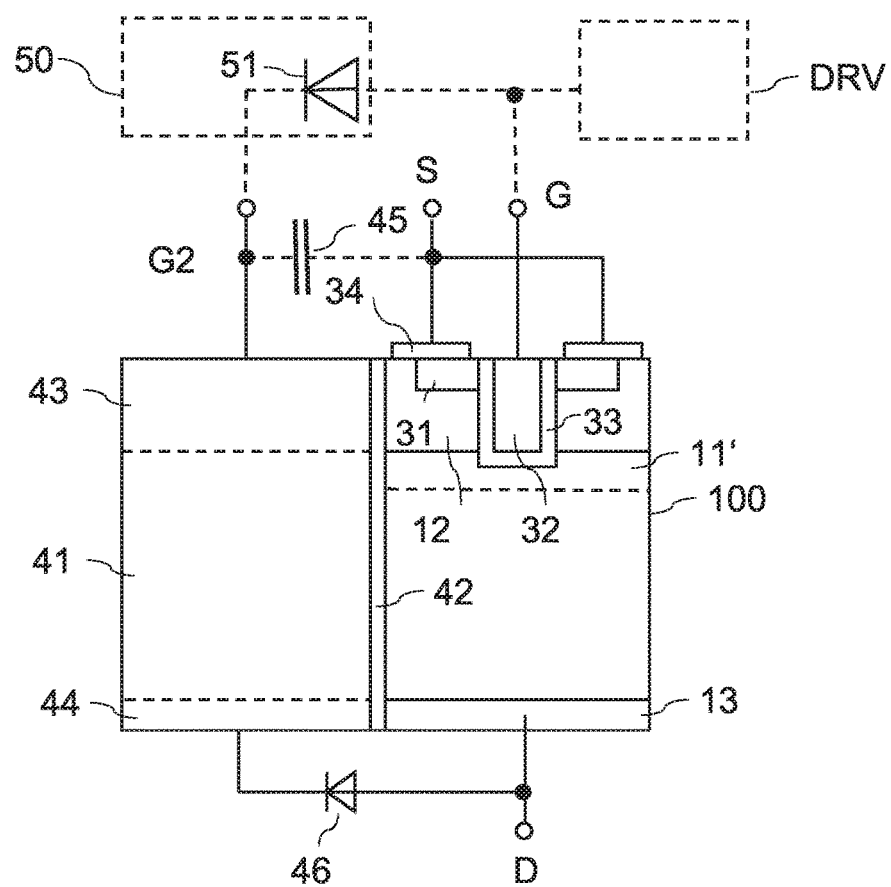
FIG. 8 illustrates a semiconductor device implemented as a vertical MOS transistor including a drift control region adjacent the drift region.

FIG. 8 illustrates a vertical cross sectional view of a MOSFET according to a further embodiment. This MOSFET further includes a drift control region 41 that is dielectrically insulated from the drift region 11 by a dielectric layer 42. The dielectric layer 42 will be referred to as drift control region dielectric 42 in the following. The drift control region dielectric 42 extends in the current flow direction. Thus, in the embodiment illustrated in FIG. 8, the drift control region dielectric 42 is a vertical dielectric layer extending in the vertical direction of the semiconductor body 100. The drift control region 41 is configured to generate a conducting channel in the drift region 11 along the drift control region dielectric 42 when the MOSFET is in an on-state. This conducting channel helps to reduce the on-resistance of the MOSFET. The MOSFET, like a conventional MOSFET, is in the on-state, when an electrical potential is applied to the gate terminal G that induces a conducting channel in the body region 12 between the source region 31 and the drift region 11 along the gate dielectric 33, and when an electrical voltage is applied between the drain and the source terminals D, S. E.g., in an n-type enhancement MOSFET, the voltage to be applied between the gate terminal G and the source terminal S in order to cause the MOSFET to be in the on-state is a positive voltage higher than the threshold voltage and the voltage to be applied between the drain terminal D and the source terminal S is a positive voltage.

The drift region 11 may have an effective doping of the first doping type, which is the doping type of the source region 31, or may have an effective doping of the second doping type, which is the doping type of the body region. The conducting channel along the drift control region dielectric 42 is an accumulation channel when the drift region 11 has the same doping type as the source region 31, and the conducting channel is an inversion channel, when the drift region 11 has an effective doping doped complementarily to the doping of the source region 31.

In the MOSFET according to FIG. 8, the on-resistance is mainly defined by the conducting channel along the drift control region dielectric 42, while the effective doping concentration of the drift region does not or does not significantly influence the on-resistance. The effective doping concentration of the drift region 11 and of the drift control region 41, however, influence the voltage blocking capability of the MOSFET. According to one embodiment, the drift region 11 and/or the drift control region 41 have an effective doping concentration that corresponds to the effective doping concentration of an intrinsic semiconductor material, which may be, e.g., between 1E12 $cm^{-3}$ and several E12 $cm^{-3}$, or even up to 1E14 $cm^{-3}$ Thus, the drift region 11 could be implemented such that the first doping concentration $N_1$ corresponds to the second doping concentration $N_2$. Optionally, the drift region 11 includes a drift region section 11' that has an effective doping of the first doping type and an effective doping concentration of 1E13 $cm^{-3}$, or more, and that extends from the channel region along the gate dielectric 33 to the drift control region dielectric 42. This section 11' of the drift region 11 "connects" the conducting channel that is generated in the body region 12 along the gate dielectric 33 and the conducting channel along the drift control region dielectric 42 when the semiconductor device is in the on-state.

Further, the semiconductor device may include a rectifier element 46, such as a diode, connected between the drain region 13 and a drain-sided end of the drift control region 41. The drift control region 41 extends along the drift region in a current flow direction of the MOSFET, The "drain-sided end" of the drift control region 41 is the end that is located towards the drain region 13. Consequently, a "source-sided end" of the drift control region 41 is the end that is located towards the source region 31 (or source electrode 34) of the MOSFET. Optionally, the rectifier element 44 is connected to a connection region 44 which has the same doping type as the source and drain regions 31, 13, so that the connection region 44 is n-doped in an n-type MOSFET and p-doped in a p-type MOSFET. The connection region 44 has a higher doping concentration than the drift control region 41. The doping concentration of the connection region 44? is, for example, in the range of between 1E18 $cm^{-3}$ and 1E21 $cm^{-3}$.

The MOSFET may further include a semiconductor region 43 doped complementarily to the source and drain regions 31, 13 of the MOSFET and adjoining the drift control region 41 at a source-sided end of the drift control region 41. In an n-type MOSFET the semiconductor zone 43 is p-doped, and in a p-type MOSFET the semiconductor zone 43 is n-doped.

The (effective) doping concentration of the drift control region 31 may correspond to the effective doping concentration of the drift region 11. The doping type of the drift control region 31 may correspond to the doping type of the drift region 11, or may be complementary to the doping type of the drift region. According to one embodiment, the drift control region 31 and the drift region 11 are intrinsic with a doping concentration as explained above.

The basic operating principle of the semiconductor device of FIG. 8 is now explained. For explanation purposes it is assumed that the MOSFET is an n-type enhancement MOSFET with an n-doped drift zone 11, and that the drift control region 41 has the same doping type as the drift region 11. For explanation purposes it is further assumed that a biasing source 50 is connected to the drift control region 41 and that the biasing source 50 is configured to bias the drift control region 41 to have a positive potential relative to the electrical potential of the source terminal S (source potential), when the MOSFET is in the on-state. The MOSFET is in the on-state, when a drive potential applied to the gate terminal G (by a gate drive circuit DRV that is illustrated in dashed lines FIG. 8) generates a conducting channel in the body region 12 between the source region 31 and the drift region 11, and when a positive voltage is applied between the drain and the source terminals D, S. In the on-state, the drift control region 41, which has a higher electrical potential than the drift region 11, generates an accumulation channel in the drift region 11 along the drift control region dielectric 42. This accumulation channel significantly reduces the on-resistance of the MOSFET as compared to a MOSFET without a drift control region. When the drift region 11 is doped complementarily to the source and drain regions 31, 13, the drift control region generates an inversion channel in the drift region 11 along the drift control region dielectric 42.

The MOSFET is in the off-state, when the channel in the body region 12 along the gate dielectric 33 is interrupted. In this case, a depletion region expands in the drift region 11 beginning at a pn-junction between the body region 12 and the drift region 11. The depletion region expanding in the drift region 11 causes a depletion region also to expand in the drift control region 41, which, like the drift region 11, may include a monocrystalline semiconductor material. By virtue of a depletion region expanding in the drift region 11 and a depletion region expanding in the drift control region 41, a voltage across the drift control region dielectric 21 is limited.

Referring to FIG. 8, a capacitive storage element 45 can be connected between the drift control region 41 and the source terminal S. In the off-state of the MOSFET, the capacitive storage element 45 serves to store electrical charges that are required in the drift control region 41 when the MOSFET is in its on-state. These charges are positive charges in an n-type MOSFET and can be provided by the semiconductor zone 43. The capacitive storage element 45 may be integrated partially or completely in the drift control region 41 or the semiconductor region 43.

The rectifier element 46 allows charge carriers that are thermally generated in the drift control region 41 to flow to the drain region 13, in order to prevent an electrical potential of the drift control region 41 to increase in an uncontrolled manner. The rectifier element 46 therefore operates as a voltage limiting elements that limits a voltage difference between the electrical potential of the drift control region 41 and the drain electrode 13. This rectifier element 46 is connected up such that in the on-state of the MOSFET the drift control region 41 may assume a higher electrical potential than the potential at the drain terminal D.

The biasing source 40 that is connected to the drift control region 41 or to the optional semiconductor region 43 via this optional semiconductor region 33 can be implemented in many different ways. One possible example is illustrated in FIG. 8.

Referring to FIG. 8, the biasing source 50 can be connected to the gate terminal G and can include a rectifier element 51, such as a diode, connected between the gate terminal G and the drift control region 31. The polarity of the diode illustrated in FIG. 8 applies to an n-type MOSFET in which the gate terminal has an electrical potential higher than the source and body regions 31, 12 when the MOSFET is in the on-state. In this embodiment, the drift control region 41 is charged through a gate drive circuit DRV (illustrated in dashed lines in FIG. 2) each time, the electrical potential at the gate terminal is higher (in an n-type MOSFET) or lower (in a p-type MOSFET) than the electrical potential of the drift control region 41.

The MOSFET of FIG. 8 can be implemented with a cell-like structure and may include a plurality of transistor cells connected in parallel. In FIG. 8, only one transistor cell is shown. Each transistor cell includes a source region 31, a body region 12, a drift region 11, a drain region 13, a gate electrode 32, a gate dielectric 33, a drift control region dielectric 41 and a drift control region 41, where each of these device regions may be shared by two or more transistor cells.

The MOSFETs of FIGS. 6, 7 and 8 are shown with gate electrodes buried in trenches. However, this is only an example, these MOSFETs may also be realized with planar gate electrodes (planar transistor cells) as shown in FIG. 5.

Figure 9:
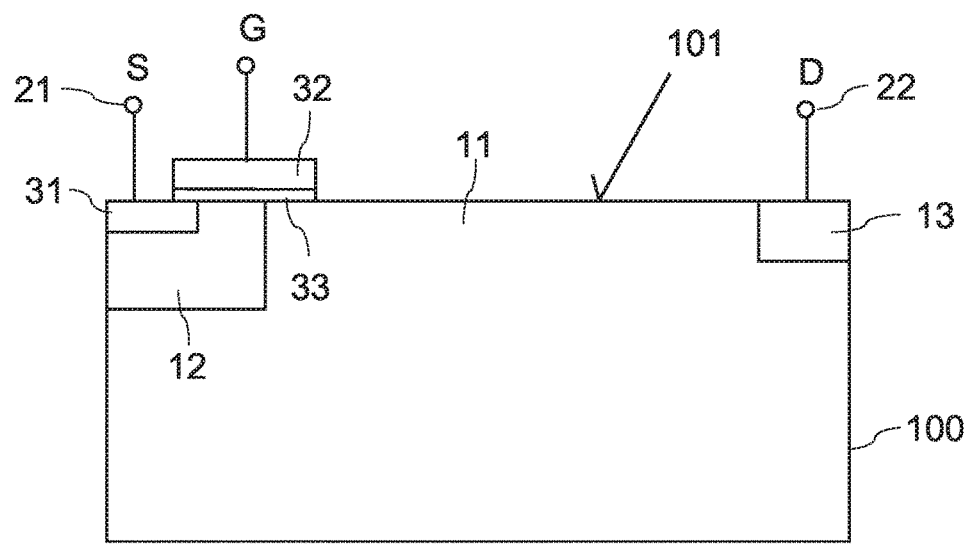
FIG. 9 illustrates an embodiment of a lateral MOS transistor.

A drift zone with a co-doping of dopant atoms of the first doping type and dopant atoms of the second doping type, such as the drift zone 11 explained with reference to FIGS. 1 to 8 herein before, if, of course, not restricted to be implemented in vertical power devices, such as the vertical MOSFETs of FIGS. 3 and 5 to 8. FIG. 9 illustrates a vertical cross sectional view of a lateral power transistor having a drift region 11 that includes a co-doping of dopant atoms of the first and second doping types. In the lateral power transistor of FIG. 9, the drain region 13 and the source region 31 are distant in a lateral direction of the semiconductor body 100. In the embodiment of FIG. 9, the gate electrode 32 is arranged above the first surface 101 of the semiconductor body 100. However, this is only an example. The gate electrode 32 could also be integrated in a trench of the semiconductor body 100.

Figure 10:
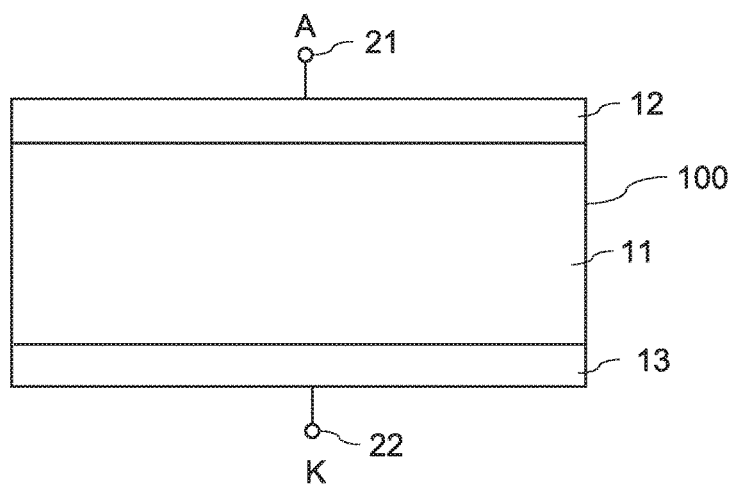
FIG. 10 illustrates a semiconductor device implemented as a diode.

FIG. 10 illustrates a vertical cross sectional view of a power semiconductor device implemented as a diode. The diode of FIG. 10 includes the basic device structure illustrated in FIG. 1 with a drift/base region 11 and a first device region 12. In a diode, the drift region 11 is often also referred to as base region. The diode further includes a second device region 13 separated from the first device region 12 by the drift (base) region 11. The first and second device regions 12, 13 are emitter regions of the diode. One of these device regions has an effective doping of the first doping type, and the other one of the device regions has an effective doping of the second doping type. For explanation purposes it is assumed that the first device region 12 has an effective p-doping and forms a p-emitter of the diode, while the second device region 13 has an effective n-doping and forms an n-emitter of the diode. The drift region 11 has an effective n-doping or an effective p-doping and has a lower effective doping concentration than each of the first and second emitter regions 12, 13. The doping concentrations of the emitter regions 12, 13 is, e.g., higher than 1E19 cm$^{-3}$.

According to a further embodiment, the diode according to FIG. 10 is implemented as a Schottky diode. In this case, the first device region 12 is a Schottky region or Schottky metal.

Figure 11A:
FIGS. 11A to 11D illustrate a first embodiment of a method for producing a drift region of a semiconductor device.

An embodiment of a method for forming a drift region 11 with a co-doping of dopant atoms of the first doping type and the second doping type is explained with reference to FIGS. 11A to 11D below. FIGS. 11A to 11D each show vertical cross sectional views of the semiconductor body 100 before or after individual method steps of the method. Referring to FIG. 11A a semiconductor substrate 110 is provided. The semiconductor substrate 110 may have a basic doping of the first doping type or of the second doping type, or may be intrinsic.

Referring to FIG. 11A, a first epitaxial layer 120$_1$ is grown on one surface of the semiconductor substrate 110. The epitaxial layer 120$_1$ may have a basic doping of the first doping type, a basic doping of the second doping type, or may be intrinsic. Referring to the explanation above, an intrinsic semiconductor layer has a doping concentration of less than 1E14 cm$^{-3}$, less than 5E13 cm$^{-3}$, or even less than 5E13 cm$^{-3}$, Referring to FIG. 11B, dopant atoms of the first doping type and dopant atoms of the second doping type are implanted into the first epitaxial layer $120_1$. According to one embodiment, molecules are implanted into the epitaxial layer $120_1$ that include dopant atoms of the first doping type and dopant atoms of the second doping type in a ratio of 1:1. In this method in which the dopant atoms of the first and second doping types are provided from the same dopant source, exactly the same number of dopant atoms of the first doping type and of dopant atoms of the second doping type are implanted into the epitaxial layer $120_1$. Let D be the dopant dose of the dopant atoms containing molecules, than $D_1=D_2$, where $D_1$ is the dopant dose of dopant atoms of the first doping type, and $D_2$ is the dopant dose of dopant atoms of the second doping type. These dopant doses are selected dependent on a desired doping concentration of first and second dopant atoms in the epitaxial layer $120_1$. Assuming that the implanted dopant atoms are homogenously distributed in the epitaxial layer $120_1$ at the end of the manufacturing process, then the doping concentration of the first dopant atoms is given by $N_1=D_1/d$, and the doping concentration of the second dopant atoms is given by $N_2=D_2/d$, where d is the thickness of the epitaxial layer $120_1$.

According to one embodiment, the dopant source includes molecules that each include at least one dopant atom of the first doping type and at least one dopant atom of the second doping type. The number of dopant atoms of the first doping type in one molecule and the number of dopant atoms of the second doping type in one molecule are in a fixed ratio, such as, e.g., 1:1. However, it is also possible to use molecules with a ratio other than 1:1. When the molecules are implanted into the epitaxial layer $120_1$, the molecules split up so that dopant atoms of the first and second type are available in the epitaxial layer $120_1$. The doping concentration of first and second dopant atoms is dependent on the dopant dose of the molecules and on the ratio of first and second type dopant atoms in each molecule. Suitable molecules are, e.g., $H_2B$—$PH_2$, BP, BPF, $BPF_2$, $H_2B$—$AsH_2$, BAs, BAsF, $BAsF_2$, where H: hydrogen, B: boron, P: phosphorous, F: fluorine, As: arsenic. In these molecules, boron (B) is p-doping and phosphorous (p) and arsenic (As) are n-doping.

According to a further embodiment, dopant atoms of the first doping type and dopant atoms of the second doping type are subsequently implanted into the epitaxial layer $120_1$ or are implanted from different dopant sources at the same time.

Figure 11B:
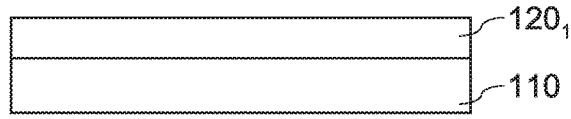
Figure 11C:
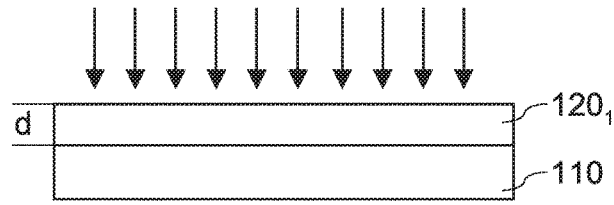

The method steps illustrated in FIGS. 11B and 11C of forming an epitaxial layer and of introducing dopant atoms of the first and second doping type into the epitaxial layer can be repeated several times, where in each repetition of the method steps an epitaxial layer is formed on the epitaxial layer that has previously being produced. According to one embodiment, the uppermost epitaxial layer, which is epitaxial layer $120_5$ in FIG. 11D, includes dopant atoms of only one doping type, namely the doping type of the desired net doping. Usually at least one additional layer (not illustrated), such as an oxide layer, is produced on the uppermost epitaxial layer. A co-doping of the uppermost epitaxial layer $120_5$ may result in different segregation effects for the different co-doping species at an interface between this additional layer and the uppermost epitaxial layer $120_5$. Such segregation effects can be prevented by providing only one doping type in the uppermost epitaxial layer $120_5$. The uppermost epitaxial layer $120_5$ is the epitaxial layer in which active device region, such as body 12 and source 31 regions of a MOSFET or an IGBT are formed. The net doping of the uppermost epitaxial layer $120_5$ may correspond to the desired doping of the body region 12. The source region 31 can be produced using implantation and for diffusion processes.

Figure 11D:
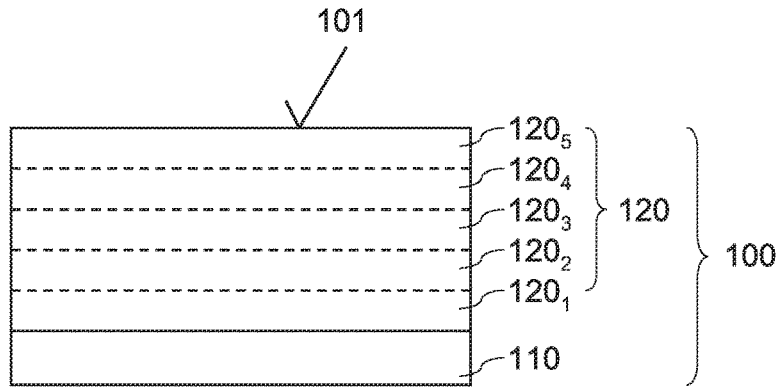

FIG. 11D illustrate a semiconductor body 100 with the substrate 110 and with several epitaxial layers $120_1$-$120_5$ formed on the substrate 110. The individual epitaxial layers $120_1$-$120_5$ form an overall epitaxial layer 120. Boundaries between the individual epitaxial layers $120_1$-$120_5$ are not visible in the epitaxial layer 120. These boundaries are only shown (by dashed lines) for illustration purposes in FIG. 11D.

In order to activate the dopant atoms implanted into the individual epitaxial layers $120_1$-$120_5$ an annealing process may be performed. In this annealing process the implanted dopant atoms diffuse in the individual epitaxial layers and are activated. An annealing process can be performed after each implantation process, or can be performed after the individual epitaxial layers $120_1$-$120_5$ have been formed. The diffusion of the implanted dopant atoms in the annealing process causes the implanted dopant atoms to be homogenously or to be at least homogenously distributed in the individual epitaxial layers $120_1$-$120_5$ and, therefore in the overall epitaxial layer 120. If a homogeneous distribution of the first and second type dopant atoms is desired, first and second type dopant atoms are used that have similar diffusion constants, such boron (B) and phosphorous (D) in silicon.

The semiconductor body 100 illustrated in FIG. 11D can be used as a basis for each of the semiconductor devices explained before. E.g. in the vertical power transistors explained before, the semiconductor substrate 110 may form the drain region 13, while the epitaxial layer 120 may form the drift region 11, where in the region of the first surface 101 further device regions, such as body and source regions 12, 31 and the gate electrode 32 can be formed.

The epitaxial layer 120 that forms a drift region 11 and that may also form the body region 12 can be produced with a basic doping of the first doping type or of the second doping type. Dependent on how the dopant atoms are introduced into the individual epitaxial layers $120_1$-$120_5$ the basic doping can be obtained in different ways. When molecules are implanted into the epitaxial layers that include dopant atoms of the first doping type and dopant atoms of the second doping type, a basic doping can be obtained by either forming the individual epitaxial layers $120_1$-$120_5$ with a basic doping of the first doping type or the second doping type, or by additionally implanting dopant atoms of the first doping type or of the second doping type into the individual epitaxial layers. Of course, it is also possible to produce the epitaxial layers with a basic doping and to additionally implant dopant atoms of the first or second doping type into the individual epitaxial layers.

When the dopant atoms of the first and second doping type are implanted from different dopant sources, then the first and second dopant atoms can be implanted with different dopant doses, so as to obtain a basic doping of one of the first and second doping types.

Instead of implanting the dopant atoms into the individual epitaxial layers $120_1$-$120_5$ it is also possible to provide the doping molecules, that may include one atom of each of the first and second doping type, already during the epitaxial crystal growth in a direct, e.g., gaseous doping process during the epitaxial deposition. In this case, the epitaxial process does not need to be interrupted to implant dopant atoms, but only one epitaxial growth process my be performed to produce a semiconductor layer corresponding to the layer stack $120_1$-$120_5$ on the substrate 110. In this process, the addition of dopant atoms containing gases to the process gas may vary in order to provide for a different doping in the uppermost section of epitaxial layer.

A further alternative to the implantation of doping molecules into individual epitaxial layers is to deposit doping molecules, that may include one atom of each of the first and second doping type, on each epitaxial layer $120_1$-$120_5$, and to then drive the doping atoms into the semiconductor body. This process may be used subsequently as shown in FIG. 11D.

Figure 12A:
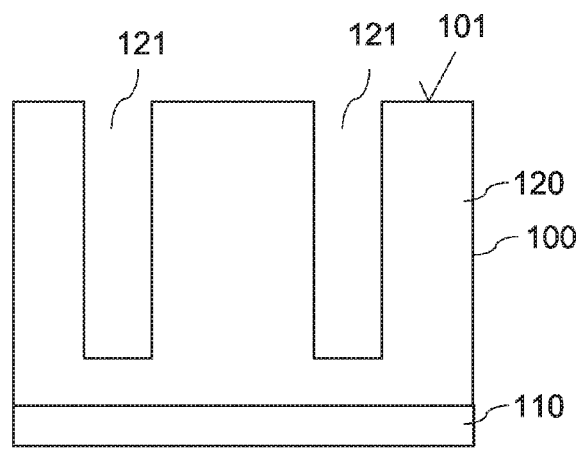
FIGS. 12A and 12B illustrate a second embodiment of a method for producing a drift region of a semiconductor device.
Figure 12B:
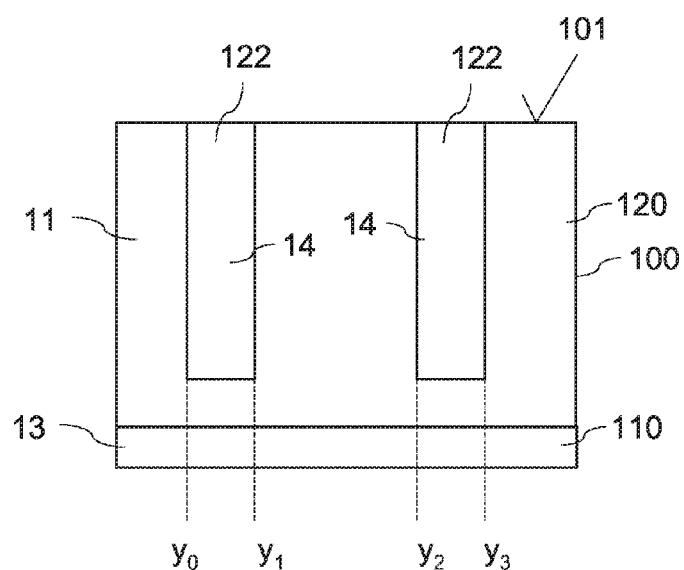

FIGS. 12A and 12B illustrate a method for forming a semiconductor body 100 that includes a drift region 11 with an effective doping of a first doping type and compensation regions 14 with an effective doping of the second doping type. The method steps illustrated in FIGS. 12A and 12B are based on a semiconductor body 100 as illustrated in FIG. 11D and including a semiconductor substrate 110 and an epitaxial layer 120 with a co-doping of dopant atoms of the first and second doping type. The doping concentrations of the dopant atoms of the first and second doping type can be identical. However, it is also possible to have an effective doping of the first or second doping type.

Referring to FIG. 12A trenches 121 are formed in the epitaxial layer 120. Referring to FIG. 12B, these trenches are filled by epitaxially growing an intrinsic semiconductor material (with doping concentrations as indicated above) or a semiconductor material with a low doping concentration 122 on the semiconductor body in these trenches 121. In this connection, "a low doping concentration" is a doping concentration between 1E15 or 5E14 and a doping concentration considered as intrinsic doping concentration (less than 1E14 cm$^{-3}$, less than 5E13 cm$^{-3}$, or even less than 1E13 cm$^{-3}$.

Figure 13A:
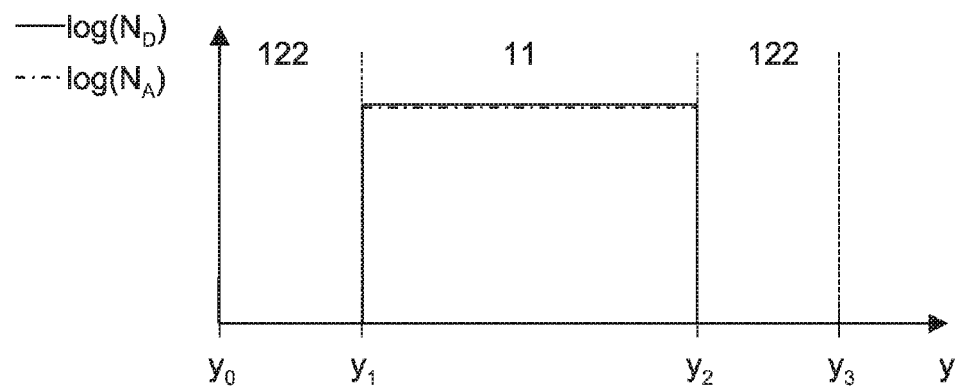
FIGS. 13A and 13B illustrate doping profiles of a semiconductor body of FIG. 12B at different times of the manufacturing process illustrated in FIGS. 13A and 13B.

FIG. 13A illustrates the doping profile of the semiconductor material 122 filling the trenches and of the mesa region between the trenches. Referring to FIG. 13A, the doping concentration in the semiconductor material 122 is negligible or much smaller compared with the individual doping concentrations of the surrounding semiconductor material 120, while the mesa region between the trenches includes dopant atoms of the first and second doping type and with a concentration of at least 1E16 cm$^{-3}$ or even at least 1E17 cm$^{-3}$. The doping concentrations $N_1$, $N_2$ can be equal or can be slightly different, so as to have an effective doping of one of the first and second doping types in the mesa region.

Figure 13B:
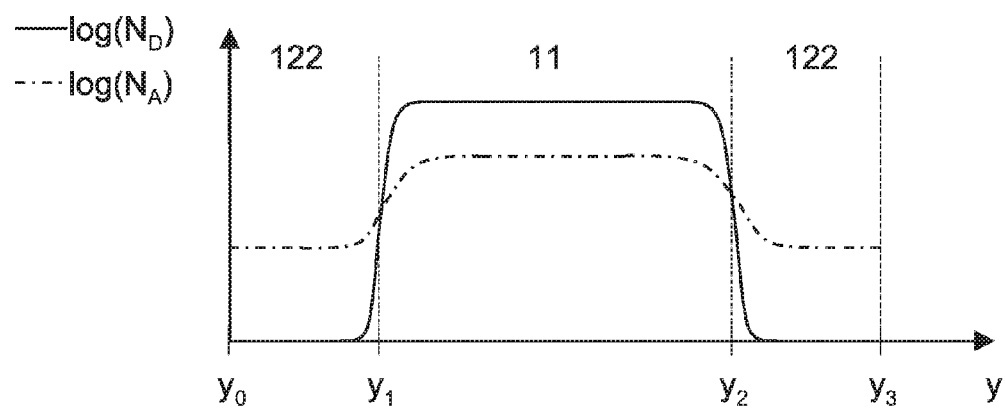

After the trenches 121 have been filled with the low doped, undoped or intrinsic semiconductor material, a thermal process is performed, in which dopant atoms from the mesa region diffuse into the undoped semiconductor region in the trenches 121. According to one embodiment, the dopant atoms of the co-doping in the mesa region 11 are chosen such that dopant atoms of the second doping type diffuse faster than dopant atoms of the first doping type. This has the effect, that the doping concentration of dopant atoms of the second doping type decreases more than the doping concentration of dopant atoms of the first doping type in the mesa region, and that the doping concentration of doping atoms of the second doping type increases more in the trenches 121 than the doping concentration of dopant atoms of the first doping type. A resulting doping profile is illustrated in FIG. 13B. Referring to FIG. 13B, the diffusion of dopant atoms of the first and second doping type at different diffusion rates has the effect that the mesa region has an effective doping of the first doping type, while the material in the trenches has an effective doping concentration of the second doping type. Suitable combinations of n-type and p-type dopant atoms that have different diffusion rates are, e.g., As/B, Sb/B, PIGa/P/Al, P/In, where As: arsenic, B: boron, Sb: antimony, P: phosphorous, Ga: gallium, Al: aluminum, In: indium. The dopant atoms of the first and second doping type each have a diffusion constant, wherein these diffusion constants are different. According to one embodiment, the smaller one of these diffusion constants is between 50% and 100% or between 80% and 100% of the other diffusion constant.

The semiconductor structure illustrated in FIG. 12B can be used to produce a superjunction transistor, with the mesa region forming a drift region 11 and with the semiconductor material in the trenches 121 forming compensation regions.

In terms of an effective compensation it is desirable to have a basically exact counterdoping, which means basically a balance of those first and second dopant atoms used to adjust the charge carrier mobility. Further dopant atoms may be present in the semiconductor body that provide for a basic doping of the first or second doping type. A balance of first and second dopant atoms may be obtained by implementing one of the above captioned methods in which first and second type doping atoms are introduced into the semiconductor body with a 1:1 ratio.

Referring to the explanation before, the co-doping of dopant atoms of the first and second doping type may help to reduce the charge carrier mobility in the drift region and, therefore, the co-doping of dopant atoms helps to increase the voltage blocking capability of the semiconductor device. However, there may be regions in the drift region 11 in which a reduction of the charge carrier mobility is not desirable. According to one embodiment, the drift region includes measures that counteract a decrease of the charge carrier mobility or that increase the charge carrier mobility.

Figure 14:
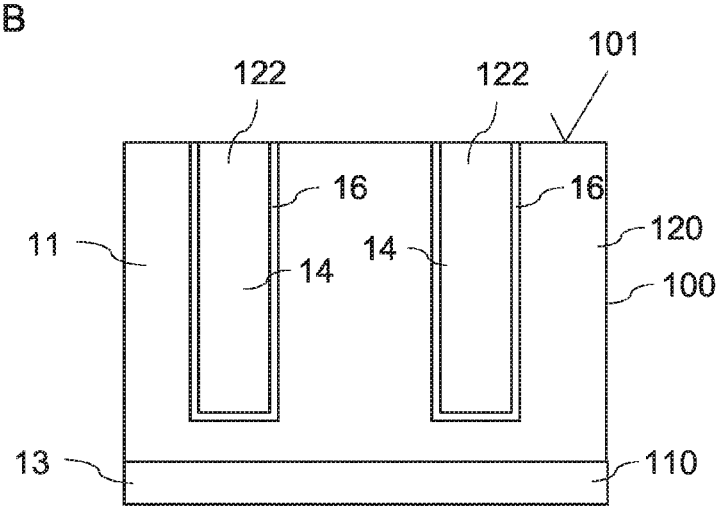
FIG. 14 illustrates a vertical cross sectional view of a semiconductor device including a drift region with a diffusion barrier.

FIG. 14 illustrates a vertical cross sectional view of a semiconductor body 100 according to a further embodiment. The semiconductor body 100 of FIG. 14 includes a drift region 11 having an effective doping concentration of one conductivity type and having at least one compensation region 14 with an effective doping concentration of the second doping type complementary to the first doping type. Further, a diffusion barrier is arranged between the drift region 11 and the compensation region 14.

The semiconductor body 100 of FIG. 14 can be obtained through the method of FIGS. 12A and 12B when additionally forming the diffusion barrier 16 at least on the sidewalls of the at least one trench 121 before filling the trench with the semiconductor material 122. Besides the sidewalls, the diffusion barrier can also be formed on the bottom of the at least one trench 121. The diffusion barrier includes, for example, silicon-germanium ($Si_{1-x}Ge_x$) or silicon-germanium-carbon ($Si_{1-x-y}Ge_xC_y$) on which silicon as the filling material of the trench 121 can be epitaxially grown.

The diffusion barrier 16 separates dopant atoms of the first and second dopant type at the interface between the diffusion barrier and the drift region 11 in that the diffusion barrier 16 allows dopant atoms of one conductivity type to diffuse through the diffusion barrier, while the diffusion of dopant atoms of the other conductivity type is prevented or at least impeded. Thus, in the diffusion process already explained with reference to FIG. 12B, dopant atoms of the one conductivity type accumulate in the trench filling material 122, resulting in an effective doping concentration of the one conductivity type in the filling material, while an effective doping concentration of the other conductivity type remains in the drift region 11 at least in those regions that are close to the interface between the drift region 11 and the diffusion barrier. E.g., SiGe or SiGeC as a barrier material allow n-type phosphorous (P) dopant atoms to more easily diffuse through the barrier than p-type boron (B) atoms. Thus, when P and B are used as doping atoms and when SiGe or SiGeC is used as the barrier material, the at least one compensation region 14 has an effective n-doping (induced by P dopant atoms), while the drift region 11 has an effective p-doping (induced by B dopant atoms)

For an effective compensation the exact counterdoping is essential and with it the method of implanting molecules that consist of doping atoms with a 1:1 ratio. For this embodiment the implantation of molecules containing boron (B) and phosphorus (P) atoms with a 1:1 ratio is a preferred, because both atoms have a very similar diffusion constant which supports the compensated doping in the mesa region before the outdiffusion via the barrier layer takes place.

Figure 15:
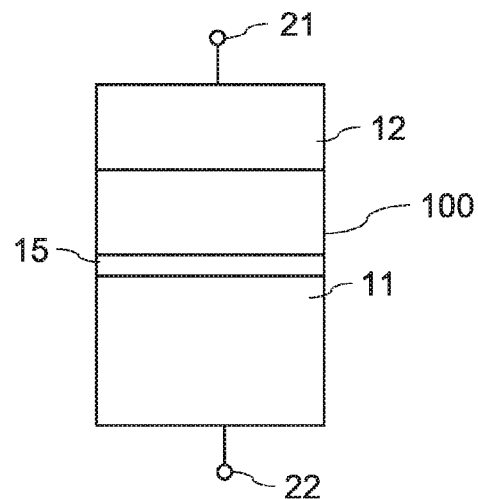
FIG. 15 illustrates a vertical cross sectional view of a semiconductor device according to yet another embodiment.

According to a further embodiment that is illustrated in FIG. 15 the drift region 11 includes at least one semiconductor layer 15 having a crystal lattice different from the crystal lattice of the semiconductor material of other regions of the drift region 11. According to one embodiment, the semiconductor body includes silicon (Si), while the semiconductor layer included silicon-germanium (SiGe). SiGe has a crystal lattice different from the crystal lattice of silicon. This causes a mechanical stress in the region of an interface between the SiGe layer and the surrounding semiconductor material. In the regions where such stress occurs, the charge carrier mobility is increased. Of course several of such layers causing mechanical stress can be provided.

The semiconductor layer 15 of FIG. 15 is a horizontal layer. However, this is only an example, this layer 15 could also be implemented as a vertical layer (not illustrated), or may include horizontal and vertical layer sections (not illustrated) such as layer sections lining sidewalls and a bottom of a trench, with the trench being filled afterwards.

When, as explained with reference to FIGS. 11A to 11D, the drift region 11 is produced using an epitaxial growth process, the layer 15, such as a SiGe layer can be easily produced in the epitaxial growth process by simply changing the precursor from a precursor producing silicon to a precursor producing SiGe.

Referring to the explanation above, the critical electrical field strength (which is the field strength at which an Avalanche breakdown occurs) can be increased in a drift region or a base region of a power semiconductor device by co-doping the drift region (base region) 11 with dopant atoms of the first and second doping type. "Co-doping" means that additionally to a desired basic doping of the drift region 11 dopant atoms of the first and second doping type with the same doping concentration are introduced into the drift region 11, so that these co-doped atoms do not affect the net doping of the drift region 11, but reduce the mean free path length of charge carriers, and, therefore, help to increase the critical electrical field strength.

Referring to the explanation above, the complete drift region 11 may be co-doped with first and second type doping atoms, so as to increase the critical electrical field strength all over the drift region 11. According to a further embodiment, only those device regions of a semiconductor device, in particular of a power semiconductor device, are co-doped with first and second type doping atoms in which a high field strength occurs in operation of the semiconductor device. Thus, the critical electrical field strength is only locally increased in this case.

Different embodiments of device regions that include a co-doping in order to locally increase the critical electrical field strength are explained with reference to FIGS. 16 to 24 below.

Figure 16:
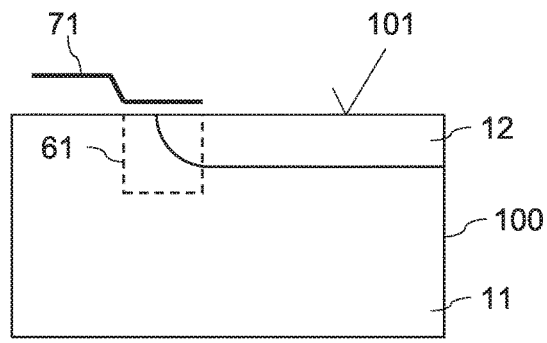
FIG. 16 illustrates a vertical cross sectional view of a semiconductor device including a co-doped semiconductor region in a curved region of a pn-junction.

FIG. 16 illustrates a vertical cross sectional view of a semiconductor body 100 in which a power semiconductor device is implemented. The semiconductor device of FIG. 16 includes a pn-junction between a first device region 11 and a second device region 12. The first and second device regions 11, 12 are, for example, a drift region 11 and a body region 12 of a MOSFET or an IGBT, or a base region 11 and an anode region 12 of a diode. Embodiments of those semiconductor devices have been explained herein before.

Referring to FIG. 16, the pn-junction has a curved region between a first surface 101 of the semiconductor body 100 and a section of the pn-junction where the pn-junction essentially runs parallel to the first surface 101. This curved region of the pn-junction is at the edge of an active device region. E.g., in a MOSFET or an IGBT the active device region includes the transistor cells (not illustrated in FIG. 16). When the pn-junction is reverse biased so that a depletion region expands in the drift region (base region) 11 the highest electrical field strength occurs in the region of the curved region of the pn-junction. In order to locally increase the critical electrical field strength in this region, the semiconductor device includes a co-doped semiconductor region 61 (illustrated in dashed lines in FIG. 16). This co-doped semiconductor region 61 includes the curved region of the pn-junction. Further, the co-doped region 61 is in the first device region 11 (drift region, base region) and the second device region 12 (body region, anode region). The net doping of the first and second device regions 11, 12 in the co-doped region 61 may correspond to the doping concentrations of these first and second device regions 11, 12 in other regions. However, the co-doped region 61 additionally includes first and second type doping atoms with the same doping concentration so as to reduce the mean free path length of the charge carriers in the co-doped region 61 without affecting the basic doping of the first and second device regions 11, 12. The doping concentration of the co-doped atoms in the region 61 is, e.g., higher than $1E18$ $cm^{-3}$.

Optionally, a field plate 71 may be arranged above the first surface 101 of the semiconductor body 100 and above the curve region of an insulating layer (not illustrated) is arranged between the field plate 71 and the semiconductor body 100. The field electrode 71 may be floating or may be electrically connected to the second device region 12. According to one embodiment, the co-doped region 61 includes boron atoms as p-type doping atoms and phosphorus atoms as n-type doping atoms. Those dopant atoms of the co-doped region 61 that do not contribute to the basic doping may be introduced into the semiconductor body from one common dopant source that includes dopant atoms of the first and second doping type in a ratio of 1:1. Examples of suitable (gaseous) dopant sources that include p-type boron (B) and n-type phosphorous atoms are $H_2B$—$PH_2$, BP, BPF, or $BPF_2$.

The (p-type or n-type) basic doping (net doping) of the first and second semiconductor devices 11, 12 may be obtained using any suitable dopant source.

Figure 17:
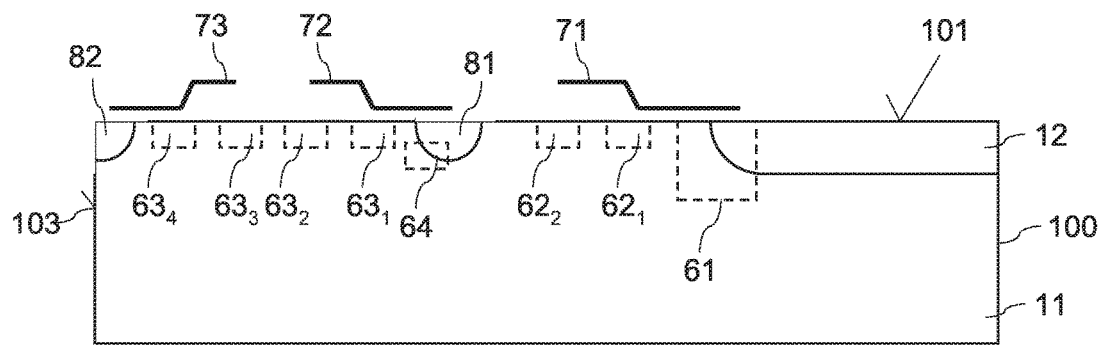
FIG. 17 illustrates a vertical cross sectional view of a semiconductor device including co-doped semiconductor regions in an edge termination structure.

FIG. 17 illustrates a vertical cross sectional view of a semiconductor device according to a further embodiment. The semiconductor device of FIG. 17 is based on the semiconductor device of FIG. 16, so that the explanation provided in connection with FIG. 16 applies to the embodiment of FIG. 17 accordingly.

The semiconductor device of FIG. 17 includes an edge termination structure between the curved region of the pn-junction and a lateral edge 103 of the semiconductor body 100. The lateral edge 103 terminates the semiconductor body 100 in a lateral (horizontal) direction of the semiconductor body 100. The edge termination structure according to the present embodiment includes one field ring 81 in the first device region 11 and adjacent the first surface 101. The field ring 81 is doped complementarily to the first device region 11 and may surround the second device region 12 in a horizontal plane of the semiconductor body 100. The field ring 81 is distant to the second device region 12 in the lateral direction of the semiconductor body 100. The semiconductor device may further include a channel stopper 82 of the same doping type as the first device region 11, but more highly doped. The channel stopper 82 is adjacent the lateral edge 103 and the first surface 101.

Referring to FIG. 17, co-doped regions $62_1$, $62_2$ may be arranged between the second device region 12 and the field ring 81 along the first surface 101. In the present embodiment, there are two co-doped regions $62_1$, $62_2$ that are mutually distant and distant to the pn-junction and the field ring 81. Further co-doped regions $63_1$, $63_2$, $63_3$, $63_4$ may be arranged between the field ring 81 and the channel stopper 82. These co-doped regions $63_1$-$63_4$ are mutually distant and distant to the field ring 81 and the channel stopper 82. Each of these co-doped regions $63_1$-$63_4$ is adjacent the first surface 101. In the embodiment of FIG. 17, co-doped regions $62_1$, $63_1$, $63_4$ are below those regions in which there is a step in the field plates 71, 72, 73, and co-doped regions $62_2$, $63_2$, $63_3$ are below the (upper) end of the field plates 71, 72, 73. These are the regions where peaks of the electric field may occur in the semiconductor body 100. These peaks are reduced by providing the co-doped regions $62_1$-$63_4$. Alternatively to providing several co-doped regions $62_1$-$63_4$, the complete edge region, which is the region between the second device region 12 and the edge 103 can be co-doped in a region along the surface 101.

The device of FIG. 17 includes at least one further co-doped region 64. This co-doped region includes a curved region of a pn-junction between the field ring 81 and the first device region 11. Concerning the doping concentrations of the first and second type doping atoms of the co-doped regions $62_1$-$62_2$, $63_1$-$63_4$, 64 of FIG. 17, as well as concerning the doping concentrations of other co-doped regions explained below, the explanation concerning co-doped region 61 of FIG. 16 applies accordingly.

Figure 18:
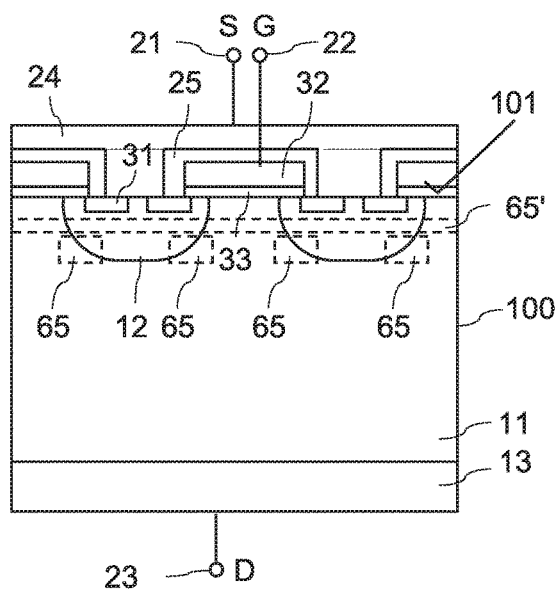
FIG. 18 illustrates a vertical cross sectional view of an MOS transistor including semiconductor device including co-doped semiconductor regions at pn-junctions between body regions and a drift region.

FIG. 18 illustrates a vertical cross sectional view of a power MOSFET or a power IGBT with a planar gate electrode 32. This semiconductor device corresponds to the semiconductor device of FIG. 5 to which reference is made. In the embodiment of FIG. 5 the body regions 12 are schematically drawn to basically have a rectangular shape in the vertical cross sectional view. This, however, only serves to explain and illustrate the basic structure of the semiconductor device. In real MOSFETs or IGBTs the body regions of planar power MOSFETs or power IGBTs have rounded corners in the vertical section plane, as illustrated in FIG. 18.

Referring to FIG. 18, the semiconductor device includes co-doped regions 65 in those regions of the pn-junction between the body regions 12 and the drift region 11 at which a maximum curvature of the pn-junction occurs. In the co-doped regions 65, the net doping concentrations of the drift region 11 and the body regions may correspond to the doping concentrations of the drift region 11 and the body regions 12 in other regions of the semiconductor body.

Additionally or alternatively, the semiconductor device further includes a co-doped semiconductor region 65' close to the surface 101 in the body regions 12. This co-doped region 65' may also be arranged in those regions of the drift region 12 that laterally adjoin the body regions 12. The co-doped region 65' close to the surface helps to improve the robustness of the semiconductor device against cosmic radiation.

Figure 19:
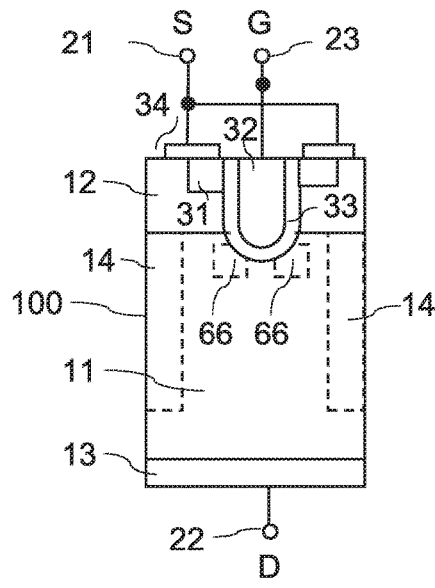
FIG. 19 illustrates a vertical cross sectional view of an MOS transistor according to a first embodiment, including co-doped semiconductor regions below a trench gate electrode.

FIG. 19 illustrates a vertical cross sectional view of a power MOS transistor including a trench gate electrode 32. The semiconductor device of FIG. 19 is based on the semiconductor device of FIG. 7 to which references made. The compensation regions 14 (that are drawn in dashed lines) are optional. The semiconductor device of FIG. 19 includes co-doped regions 66 below the gate electrode 33 in the drift region 11 along the gate oxide 33. In the embodiment of FIG. 19, these co-doped regions are located in those positions where a maximum curvature of the gate electrode and the gate dielectric 33 occurs.

According to a further embodiment illustrated in FIG. 20, the co-doped region 66 may completely extend along the gate dielectric 33 below the gate electrode 32.

Figure 20:
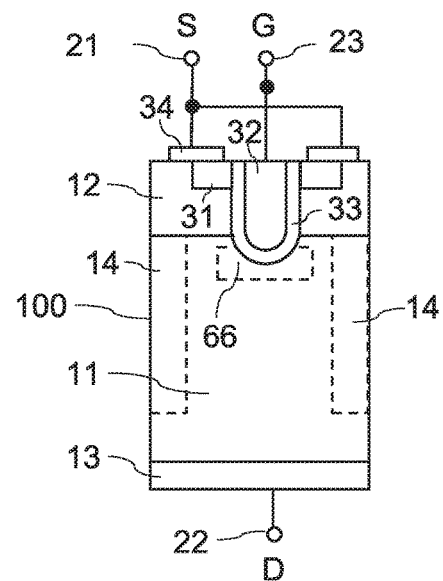
FIG. 20 illustrates a vertical cross sectional view of an MOS transistor according to a first embodiment, including co-doped semiconductor regions below a trench gate electrode.
Figure 21:
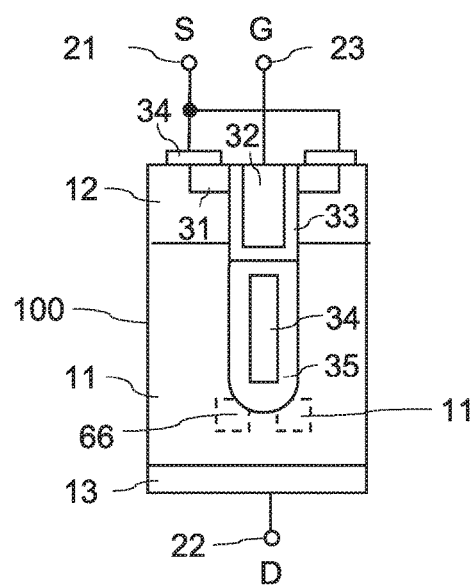
FIG. 21 illustrates a vertical cross sectional view of an MOS transistor according to a first embodiment, including co-doped semiconductor regions below a field electrode.
Figure 22:
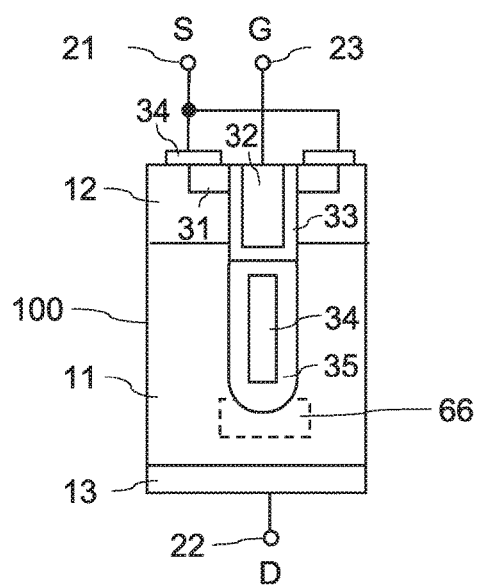
FIG. 22 illustrates a vertical cross sectional view of an MOS transistor according to a first embodiment, including co-doped semiconductor regions below a field electrode.

FIGS. 21 and 22 illustrate modifications of the semiconductor devices of FIGS. 19 and 20. In the semiconductor devices of FIGS. 21 and 22 a field electrode 34 is arranged in the drift region 11 below the gate electrode 32 and is dielectrically insulated from the drift region 11 by a field electrode dielectric 34. In these embodiments, the co-doped regions 66 are located in the drift region 11 below the field electrode 34 and adjoining the field electrode dielectric 35. While in the embodiments of FIGS. 21 and 22, the co-doped regions 66 adjoin the gate dielectric 33 and the field electrode dielectric 35, respectively. According to a further embodiment, these co-doped regions 66 are distant to the gate dielectric 33 and the field electrode dielectric 35 e.g. in the current flow direction (which the vertical direction in these embodiments). The distance is, e.g., between 50 nm and 500 nm. Implementing these co-doped regions 66 distant to the gate dielectric 33 and the field electrode dielectric 35 is, in particular, useful in IGBTs, but may be realized in MOSFETs as well.

Figure 23:
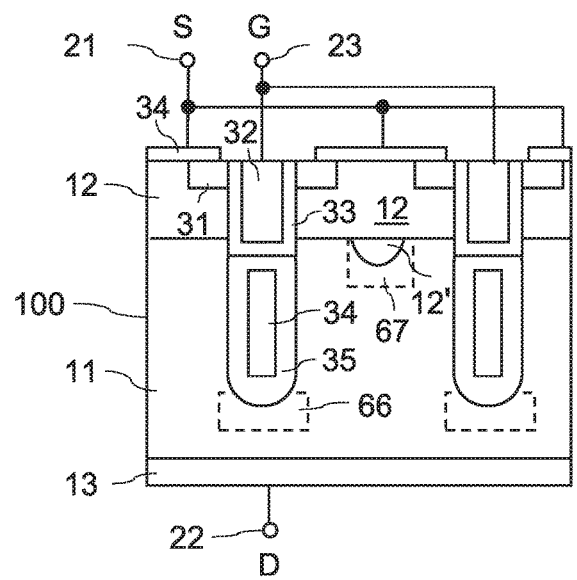
FIG. 23 illustrates a vertical cross sectional view of an MOS transistor including a co-doped semiconductor regions at a pn-junction below a curved section of a body region and the drift region.

FIG. 23 illustrates a vertical cross sectional view of an MOS transistor with a trench gate electrode 32. In this embodiment, the body region 12 includes a curved section 12' extending into the drift region 11. The semiconductor device can be implemented with field electrodes 34 (as illustrated in FIG. 23). However, according to a further embodiment, the semiconductor device can also be implemented like the semiconductor devices of FIGS. 19 and 20 without a field electrode. In the semiconductor device of FIG. 23, a co-doped region 67 is in the region of the curved body region section 12'.

Figure 24:
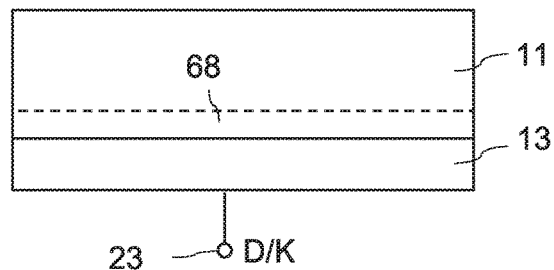
FIG. 24 illustrates a vertical cross sectional view of semiconductor device including a co-doped semiconductor regions between a drift (base) region and a drain (cathode) region.

FIG. 24 illustrates a vertical cross sectional view of a semiconductor device according to a further embodiment. FIG. 24 illustrates the drift region (base region) 11 and a drain region (collector region) 13 of a MOSFET, an IGBT or a diode, respectively In this embodiment, a co-doped region 68 is arranged in the drift region 11 adjacent the drain region (collector region) 13 or close to this drain region (collector region) 13. A field stop region (not illustrated) of the same doping type as the drift region (base region) 11 but more highly doped than the drift region (base region) 11 is located in the drift region (base region) 11 or adjacent the drain region (collector region) 13. According to one embodiment, the field stop region is arranged in the co-doped region 68.

Figure 25:
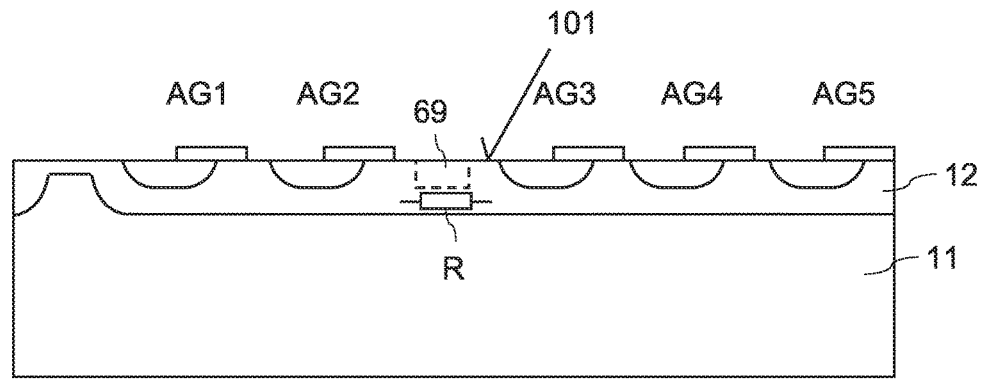
FIG. 25 illustrates a vertical cross sectional view of a thyristor including a co-doped semiconductor region.

FIG. 25 illustrates a vertical cross sectional view of an amplifying gate structure of a thyristor. The amplifying gate structure is arranged in the p-type base region 12 of the thyristor, with the p-type base region 12 adjoining an n-type base region. The amplifying gate structure includes a plurality of amplifying gates AG1-AG5, with each amplifying gate AG1-AG5 including an n-type semiconductor region and an electrode connecting the n-type semiconductor region with the p-type base region 12. The individual amplifying gates are mutually distant, where the p-type base region in a conventional manner includes an electrical resistance R (schematically illustrated in FIG. 25) between the second and third amplifying gates AG2, AG3. In the region of this electrical resistance a co-doped region 69 is implemented.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc, and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor device, the method comprising:
   i. providing a semiconductor substrate;
   ii. forming an epitaxial layer on the semiconductor substrate;
   iii. introducing dopant atoms of a first doping type and dopant atoms of a second doping type into the epitaxial layer;
   v. forming a trench in the epitaxial layer;
   vi. filling the trench with a monocrystalline semiconductor material; and
   vii. diffusing dopant atoms into the monocrystalline semiconductor material from the surrounding semiconductor material.

2. The method of claim 1, further comprising:
   iv. repeating steps ii. to iii. at least once, so as to form at least two epitaxial layers, wherein in each repetition of steps ii. to iii., the epitaxial layer produced in the current step ii. is formed on the epitaxial produced in the preceding step ii.

3. The method of claim 1, wherein in step iii. molecules are introduced that include the dopant atoms of the first doping type and the dopant atoms of the second doping type in a predefined ratio.

4. The method of claim 3, wherein the molecules are selected from the group consisting of: H2B, PH2, BP, BPF, BPF2, H2B—AsH2, BAs, BAsF, and BAsF2.

5. The method of claim 3, wherein the predefined ratio is 1:1.

6. The method of claim 1, wherein in step iii. the dopant atoms are introduced at least one of during a crystal growth of the epitaxial layer and after a crystal growth of the epitaxial layer.

7. The method of claim 1, wherein introducing the dopant atoms comprises at least one of an implantation process and a diffusion process.

8. The method of claim 1, wherein the epitaxial layer is produced with a basic doping of one of the first and second doping types.

9. The method of claim 1, wherein the dopant atoms of one of the first and second doping type are selected to have a higher diffusion rate than the dopant atoms of the other of the first and second doping type.

10. The method of claim 1, further comprising:
    viii. forming a diffusion barrier at least on sidewalls of the trench.

11. The method of claim 10, wherein the diffusion barrier comprises one of SiGe and SiGeC.

12. The method of claim 7, wherein the dopant atoms of the first and of the second doping types each have a diffusion constant, wherein a smaller one of the diffusion constants is between 50% and 100% or between 80% and 100% of the other diffusion constant.

13. The method of claim 1, further comprising:
    ix. forming a body region and a source region in the epitaxial layer; and
    x. forming a gate electrode adjacent the body region and a gate dielectric that dielectrically insulates the gate electrode from the body region.

14. The method of claim 13, wherein forming the body region comprises forming the body region such that the body region adjoins the material filling.

15. A method of producing a semiconductor device, the method comprising:
    i. providing a semiconductor substrate;
    ii. forming an epitaxial layer on the semiconductor substrate; and
    iii. introducing molecules into the epitaxial layer and that include dopant atoms of a first doping type and dopant atoms of a second doping type in a predefined ratio, so that the dopant atoms of the first and second doping types are provided from the same dopant source.

16. The method of claim 15, wherein the molecules are selected from the group consisting of: H2B, PH2, BP, BPF, BPF2, H2B—AsH2, BAs, BAsF, and BAsF2.

17. The method of claim 15, wherein the predefined ratio is 1:1.

* * * * *